(12) United States Patent
Lim

(10) Patent No.: US 7,046,054 B2
(45) Date of Patent: May 16, 2006

(54) POWER UP SIGNAL GENERATOR

(75) Inventor: Kyu-Nam Lim, Yongin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/404,136

(22) Filed: Apr. 2, 2003

(65) Prior Publication Data

US 2005/0073341 A1 Apr. 7, 2005

(30) Foreign Application Priority Data

Oct. 18, 2002 (KR) ............... 10-2002-0063789

(51) Int. Cl.
*H03L 7/00* (2006.01)

(52) U.S. Cl. .................. 327/143; 327/142; 327/198

(58) Field of Classification Search ............... 327/142, 327/143, 198, 77
See application file for complete search history.

(56) References Cited

U.S. PATENT DOCUMENTS

| 5,030,845 A | 7/1991 | Love et al. ............. 713/1 |
|---|---|---|
| 5,148,051 A | 9/1992 | Deierling et al. ........... 327/143 |
| 5,378,936 A * | 1/1995 | Kokubo et al. ............. 327/77 |
| 5,463,335 A | 10/1995 | Divakaruni et al. ........ 327/143 |
| 5,467,039 A * | 11/1995 | Bae ............................ 327/198 |
| 5,477,176 A | 12/1995 | Chang et al. ............. 327/143 |
| 5,828,329 A * | 10/1998 | Burns .......................... 341/155 |
| 5,983,346 A | 11/1999 | Wendell |

FOREIGN PATENT DOCUMENTS

JP          8256039          10/1996

* cited by examiner

*Primary Examiner*—My-Trang Nu Ton
*Assistant Examiner*—Hiep Nguyen
(74) *Attorney, Agent, or Firm*—Harness, Dickey & Pierce, P.L.C.

(57) ABSTRACT

A power up signal generator includes a signal converter for converting an applied external source voltage to a voltage applied at a trigger node when the external source voltage rises to a first threshold, and a current source for flowing a reference current from the trigger node. A first inverter connected to the trigger node outputs a low level signal when the trigger node voltage reaches a second threshold. A second inverter outputs a power up signal after receiving the low level signal from the first inverter. The signal converter may include a PMOS transistor configuration, such that the trip voltage of the power up signal generator is dependent only on a single MOSFET transistor threshold voltage.

15 Claims, 2 Drawing Sheets

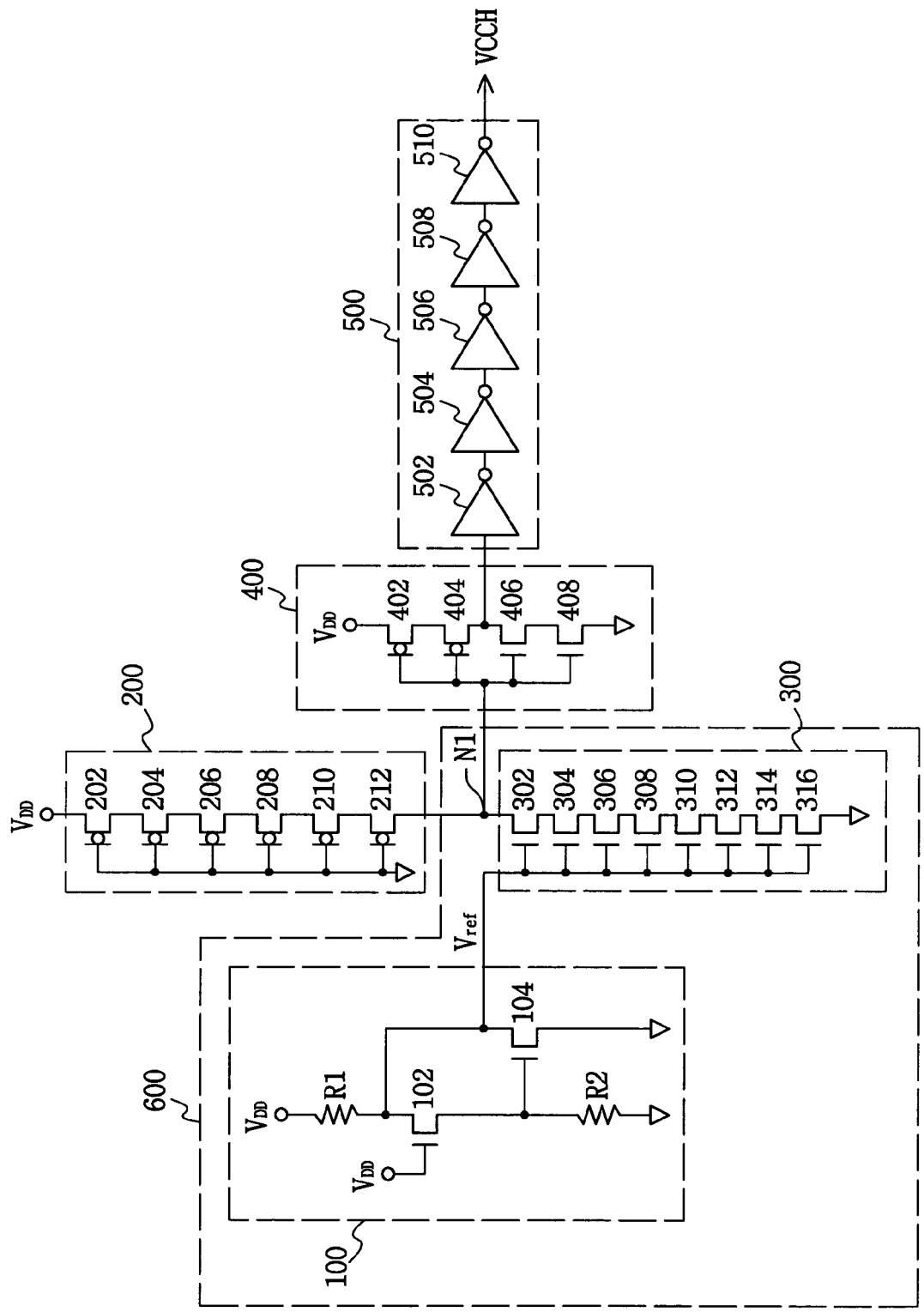

POWER UP SIGNAL GENERATOR

This U.S. nonprovisional patent application claims priority under 35 U.S.C. § 119 of Korean Patent Application 2002-63789 filed on Oct. 18, 2002, the entire contents of which are hereby incorporated by reference.

BACKGROUND OF THE INVENTION

1. Field of the Invention

The present invention relates to a power up signal generator, and more particularly, to a power up signal generator with stable operation over a range of operating temperatures.

2. Description of the Related Art

In general, a semiconductor memory device may be equipped with a power up signal generator so that the device is not enabled to operate immediately in response to the application of an external source voltage. Instead, the power up signal generator enables the device to operate after the external source voltage level rises above a threshold. The time required for the external source voltage to reach the threshold can allow for internal circuit components to stabilize at their proper states. Thus, by preventing its internal circuits from operating before the external source voltage level has become stabilized at a normal operating level, the power up signal generator helps prevent latch-ups, or other undesired effects, from corrupting the data contents of the memory device, thus enhancing the reliability of the overall chip.

The power up signal generator senses a rise in the level of the external source voltage as it is initially applied, and outputs a constant "low" level power up signal. When the external source voltage source has risen above the threshold level, the power up signal generator changes the output power up signal to a "high" state. Subsequently, if the voltage level of the applied external source voltage drops below the threshold, the power up signal generator again outputs a "low" level power up signal until the level of the external source voltage once again has risen above the threshold and is stabilized. The power up signal generator is usually implemented as an independent circuit at an initial stage of a pipeline to provide the power up signal as an internal supply voltage for subsequent internal circuits in the memory device. The power up signal is mainly used to initially activate these circuits.

A power up pulse generating circuit is disclosed in U.S. Pat. No. 5,030,845, which does not include a node connected to both a static pull-down path and a static pull-up path, thereby forming a linear circuit.

Another power up pulse generating circuit is disclosed in Japanese Laid-Open Patent Application No. 7-57474, which generates a power up signal after an applied external source voltage has completely risen to its full amount during power-up.

FIG. 1 is a circuit diagram illustrating a conventional power up signal generator.

The power up signal generator of FIG. 1 is constructed of a level sensing part 10 for sensing a level of an applied external source voltage $V_{DD}$, and inverters 12, 14 for buffering a level sense signal output from the level sensing part 10. Inverter 14 outputs a power up signal VccH.

The level sensing part 10 includes an NMOS transistor 20, which is diode-connected (i.e., its gate is connected to its drain). The NMOS transistor 20 is positioned between the external source voltage source $V_{DD}$ and an output node N1. A resistor 22 is connected between a source of the NMOS transistor 20 and a ground.

While inverters 12, 14 respectively have the same circuit components and configuration; thus FIG. 1 only illustrates the components and configuration of inverter 12 in detail. As shown, the inverter 12 is constructed of a PMOS transistor 24 and an NMOS transistor 26 connected together in series between the applied external source voltage $V_{DD}$ and the ground. The gates of these transistors 24 and 26 are connected to the node N1. The source of PMOS transistor 24 and NMOS transistor 26 is connected to an output node of the inverter 12. The inverter 14 is connected to receive the output signal of the inverter 12.

As the external source voltage $V_{DD}$ is initially applied, it rises gradually. The diode-connected NMOS transistor 20 is turned off, and a low voltage signal is applied to the node N1, until the external source voltage $V_{DD}$ reaches a threshold voltage Vth of the NMOS transistor 20. The low signal applied to the node N1 turns on the PMOS transistor 24 of the inverter 12, thus causing the low signal to be inverted and output as a high signal. The high output signal of the inverter 12 is inverted by the inverter 14. The low signal output by the inverter 14 is applied to the gate of a PMOS transistor 16. The low signal turns on the PMOS transistor 16, whose source maintains the voltage of a latch 18 at an initial voltage level, in order to prevent errant operation of the memory device.

FIG. 2 illustrates the general operation of a power up signal generator as external source voltage $V_{DD}$ rises. Referring to FIG. 2, as the level of external source voltage $V_{DD}$ gradually rises to the threshold voltage Vth of the NMOS transistor 20, the diode-connected NMOS transistor 20 is turned on, and the resistor 22 controls a current flow. After the NMOS transistor 20 is turned on, it operates as a diode; thus, the voltage applied to the node N1 is the difference between the external source voltage and the threshold voltage of the NMOS transistor 20 ($V_{DD}$–Vth).

Thereafter, the external source voltage $V_{DD}$ continues to rise until the voltage applied at node N1 ($V_{DD}$–Vth) meets the threshold voltage of the NMOS transistor 26 (also Vth) in the inverter 12, thus turning on the NMOS transistor 26. The level of the external source voltage $V_{DD}$ required to turn on the NMOS transistor 26 is referred to as the trip voltage Vtrip. Since the threshold voltages Vth of the NMOS transistors 20 and 26 are the same, the trip voltage is twice the threshold voltage Vth.

When the NMOS transistor 26 is turned on, the inverter 12 outputs a low signal. The low signal output from the inverter 12 is received by the inverter 14, which inverts the signal to produce a high signal, i.e., the external source voltage $V_{DD}$, as output signal VccH. The time required for the inverter 14 to output a high signal VccH in response to the low input signal from the inverter 12 allows the external source voltage source $V_{DD}$ to rise closer to the normal operating voltage. When the inverter 14 outputs the power up signal VccH as the high signal ($V_{DD}$) as shown in FIG. 2, the internal circuits of the memory device are activated for normal operation.

In such a conventional power up signal generating circuit, the difference between the normal level of the external source voltage $V_{DD}$ and the trip voltage Vtrip is rather small. For example, where the normal operating level of the external source voltage is 1.8V and the operating temperature of the memory device is –5° C., the trip voltage Vtrip may be set at 1.3V (where Vth is 0.65V). Thus, if the applied external source voltage $V_{DD}$ were to be lowered to 1.6v the trip voltage Vtrip of 1.3V would be very high relative to $V_{DD}$. Accordingly, minor fluctuations in the external source voltage $V_{DD}$ that dip below the trip voltage Vtrip may cause the power up signal VccH to switch to a low level, thereby disrupting the operation of the overall memory device.

Furthermore, in MOSFET transistors, the threshold voltage Vth can be affected by changes in the operating temperature. For example, the threshold voltage of an NMOS transistor typically decreases by about 200 mV in response to a temperature increase of 100° C. Since the conventional power up signal generator described above has a trip voltage Vtrip equal to twice the threshold voltage 2*Vth, the trip voltage Vtrip of the conventional power up signal generator is twice as sensitive to changes in the operating temperature. Accordingly, the trip voltage can be lowered by 400 mV according to an increase of about 100° C. Such sensitivity to temperature can cause unstable operation for conventional power up signal generators.

SUMMARY OF THE INVENTION

According to exemplary embodiments of the present invention, a power up signal generator includes a signal converter for converting an external source voltage signal to an internal voltage signal, which is applied at a trigger node when the external source voltage signal level reaches a first threshold, i.e., a trip voltage. A reference current source causes a reference current to flow from the trigger node when the first threshold is met. A first inverter may be connected to the trigger node to output the external source voltage until the internal supply voltage applied at the node reaches a second threshold, at which point the first inverter outputs a low level signal. A second inverter, which receives the output signal from the first inverter, outputs the external voltage source as a power up signal after the first inverter outputs the low level signal.

According to an exemplary embodiment, the reference current source is a constant current source that maintains a constant current to flow from the trigger node over changes in temperature.

According to an exemplary embodiment, the reference current source may implement proportional to absolute temperature (PTAT) technology that maintains a current to flow from the threshold voltage node, which is proportionally dependent upon the operating temperature.

According to an exemplary embodiment of the present invention, a suitable trip voltage of the power up signal generator can be made dependent upon the threshold voltage of a single PMOS transistor in the signal converter and the current source flowing from the trigger node. By reducing the dependency of the trip voltage on MOSFET transistor threshold voltages, the trip voltage can be less affected by changes in operating temperature for the power up signal generator. Therefore, a power up signal generator can provide greater consistency for generating a power up signal in response to changes in temperature.

According to an exemplary embodiment, the current source includes a reference voltage generator for generating a reference voltage. The amount of current that the current source causes to flow from the trigger node may be dependent on the generated reference voltage, such that the trip voltage of the power up signal generator can be effectively reduced to about the level of a single PMOS transistor threshold voltage. Reducing the trip voltage to such a level helps prevent a power up signal to be disabled (i.e., switched to a low level signal) when the external source voltage drops.

BRIEF DESCRIPTION OF THE DRAWINGS

The above and other features of the present invention will become readily apparent from the description of exemplary embodiments that follows with reference to the accompanying drawings, in which like reference numerals and symbols designate like elements, in which:

FIG. 4 is a circuit diagram illustrating a power up signal generator according to another exemplary embodiment of the present invention.

DETAILED DESCRIPTION OF THE PREFERRED EMBODIMENTS

The present invention and exemplary embodiments thereof are more fully described below with reference to the accompanying drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 1:
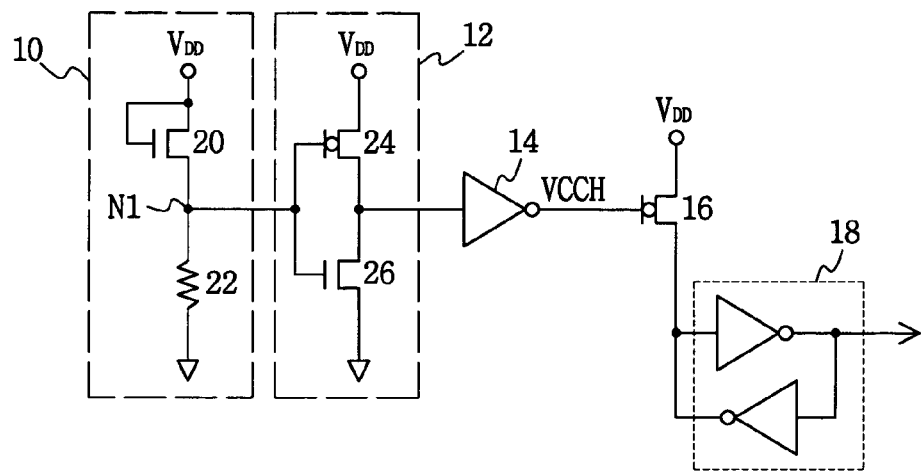
FIG. 1 is a circuit diagram illustrating a conventional power up signal generator.
Figure 2:
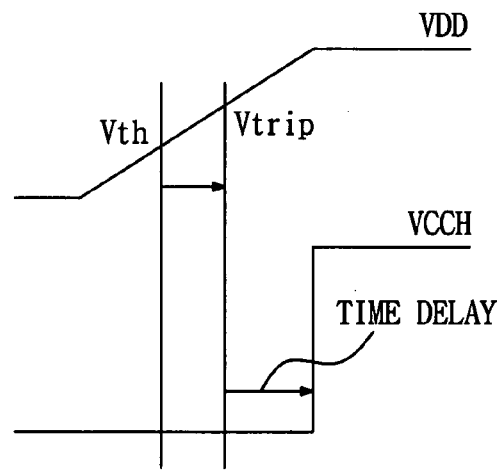
FIG. 2 is a signal diagram illustrating the general operation of a power up signal generated as an external source voltage initially rises, according to an exemplary embodiment of the present invention.
Figure 3:
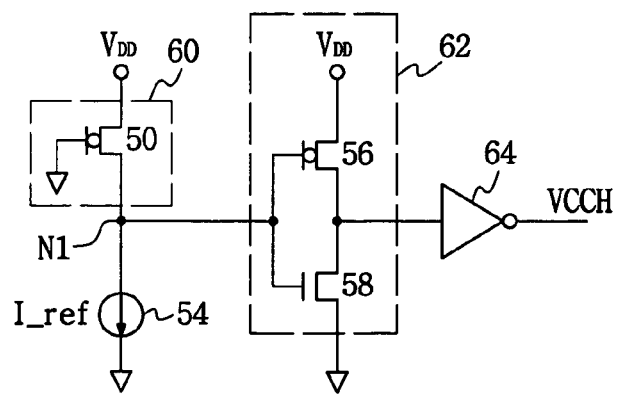
FIG. 3 is a circuit diagram illustrating a power up signal generator according to an exemplary embodiment of the present invention.

FIG. 3 is a circuit diagram illustrating a power up signal generator according to an exemplary embodiment of the present invention.

The power up signal generator of FIG. 3 includes a signal converter 60 for converting the applied external source voltage $V_{DD}$ to an internal signal applied node N1 (sometimes referred to as trigger node) when the external source voltage $V_{DD}$ reaches a threshold. As shown FIG. 3, the signal generator may comprise a PMOS transistor 50, which is positioned between an external source voltage $V_{DD}$ and a node N1. In this exemplary embodiment, the PMOS transistor 50 is configured such that its gate is grounded, its drain is connected to the node N1, and the external source voltage VDD is applied to its source. Thus, the PMOS transistor 50 supplies a current to the trigger node N1 when the external source voltage $V_{DD}$ rises above the threshold voltage Vth of the transistor 50.

Referring to FIG. 3, in an exemplary embodiment, a current source 54 is connected between the node N1 and a ground, for flowing a predetermined current. A first inverter 62 includes a PMOS transistor 56 and an NMOS transistor 58, which are connected with each other in series between the applied external source voltage $V_{DD}$ and the ground, and whose gates are commonly connected to the node N1. A second inverter 64 is connected to the output node of the inverter 62, which inverts the output signal of the inverter 62. In an exemplary embodiment, the second inverter 64 imposes a constant time delay before the inverted signal is output.

Operations of the power up signal generator of an exemplary embodiment are described below with reference to FIG. 3.

As the external source voltage $V_{DD}$ is initially applied to the power up signal generator, it rises gradually. At this time, because the gate of the PMOS transistor 50 in the signal converter 60 is grounded, the PMOS transistor 50 is turned off until the external source voltage source $V_{DD}$ becomes a threshold voltage Vth. While the PMOS transistor is turned off, a low signal is applied to the node N1, which turns on the PMOS transistor 56 of the first inverter 62. Thus, the inverter 62 inverts the low signal to output a high signal.

The high signal output by the first inverter 62 is inverted by the second inverter 64, which outputs a low signal. The output of the second inverter 64 is a power up signal VccH. The initial low level power up signal VccH is applied and maintained as an initial voltage of a latch node (not shown in FIG. 3).

Subsequently, when the external source voltage source $V_{DD}$ reaches the threshold voltage Vth of the PMOS transistor 50, the PMOS transistor 50 is turned on, causing a current to flow to trigger node N1 and the current source 54. Thus, the signal converter applies a signal to node N1, the signal being an internal supply voltage signal.

According to an exemplary embodiment, the current source 54 flows a reference current $I_{ref}$ when the PMOS transistor 50 is turned on.

After the PMOS transistor 50 is turned on, the voltage source $V_{DD}$ continues to rise so that the amount of current flowing through the source and the drain of the PMOS transistor 50 is more than the reference current $I_{REF}$ flowing from node N1 to the current source 54. As a result, the internal supply voltage signal applied at the node N1 rises to the threshold voltage Vth of the PMOS transistor 50.

At the time the voltage at the trigger node N1 (the internal supply voltage) reaches the threshold voltage Vth, the external source voltage $V_{DD}$ has reached the trip voltage Vtrip of the power up signal generator. When this occurs, the NMOS transistor 58 of the first inverter 62 is turned on, and the inverter 62 inverts the high signal at node N1 and outputs a low signal.

After a time delay, the low signal output from the first inverter 62 is inverted and output by the second inverter 64, which according to an exemplary embodiment, allows the voltage source $V_{DD}$ to rise to a normal operating voltage. The power up signal VccH can therefore be output at a normal operating voltage level of $V_{DD}$.

Thus, when the power up signal VccH is output as a high signal by the second inverter 64, the memory internal circuit operates normally.

According to this embodiment, the trip voltage Vtrip of the external source voltage $V_{DD}$ can be determined according to Equation 1:

$$V_{TRIP} = V\text{th} + (2I_{Ref}/\beta)^{1/2}, \qquad \text{Eq. 1}$$

where

β is defined as the gate capacitance per unit area (in terms of $\mu C_{OX}$) of the PMOS transistor 50.

As discussed above, the trip voltage Vtrip is the level required of the external source voltage $V_{DD}$ for the signal converter 60 to apply the voltage at node N1 for turning on the NMOS transistor 58 of the inverter 62. As shown in Equation 1, the trip voltage Vtrip has a dependency on a single MOSFET transistor threshold voltage Vth (corresponding to PMOS transistor 50) and the reference current $I_{Ref}$. Therefore, the trip voltage Vtrip can be set as low as 0.7V, which may appropriate for situations where a low external source voltage $V_{DD}$ is used.

According to an exemplary embodiment, the current source 54 is a constant current source, which is substantially unaffected by changes in operating temperature. In such an exemplary embodiment, the term $I_{Ref}/\beta$ in Equation 1 will not change substantially according to temperature changes. Accordingly, the trip voltage Vtrip may only vary by 200 mV in response to a temperature change of 100° C. (rather than 400 mV), because Vtrip is influenced only by the deviation of a single threshold voltage Vth.

According to another exemplary embodiment, the current source 54 may comprise a proportional to absolute temperature (PTAT) current source. In such an exemplary embodiment, the reference current $I_{Ref}$ of the current source 54 increases substantially linearly with increasing temperature. In view of Equation 1, a PTAT current source can provide a temperature-dependent reference current $I_{Ref}$ that helps offset deviations in the threshold voltage Vth. Thus, a deviations in the trip voltage Vtrip of the power up signal generator based on changes in operating temperature can be decreased. Various implementations and design parameters for a PTAT current source in exemplary embodiments of the present invention will be readily apparent to those ordinarily skilled in the art.

FIG. 4 is a circuit diagram illustrating a power up signal generator according to another exemplary embodiment the present invention. The power up signal generator illustrated in FIG. 4 similarly contains a signal converter 200 connected to trigger node N1, a first inverter 400 receiving the internal supply voltage signal applied to node N1, a second inverter 500 connected to the output of the first inverter 400, and a current source 600 connected to node N1.

According to an exemplary embodiment, the current source includes a reference voltage generator 100 for generating a reference voltage $V_{Ref}$ and an NMOS transistor array 300 comprising one or more NMOS transistors.

According to an exemplary embodiment, the reference voltage generator 100 may comprise an NMOS transistor 102 whose gate receives the external source voltage and whose source is connected to the ground. The reference voltage generator includes a resistor R1 coupling the external source voltage $V_{DD}$ to the drain of the NMOS transistor 102; a resistor R2 connected between the source of the NMOS transistor 102 and the ground; and an NMOS transistor 104 connected between the drain of the NMOS transistor 102 and the ground, whose gate is connected to the source of the NMOS transistor 102.

In an exemplary embodiment, the NMOS transistor array 300 includes one or more NMOS transistor connected in series between the trigger node N1 and the ground. The gates of each of the one or more NMOS transistor receives the generated reference voltage $V_{Ref}$ from the reference voltage generator. The drain of the NMOS transistor closest to trigger node N1 is connected to the node N1, while the source of the NMOS transistor at the other end of the array 300 is connected to ground. While FIG. 4 illustrates an embodiment in which the NMOS transistor array 300 includes eight NMOS transistors 302, 304, 306, 308, 310, 312, 314, 316, the configuration of FIG. 4 is exemplary in nature and should not be construed as limiting the number of NMOS transistors included in the NMOS transistor array 300.

In an exemplary embodiment, the signal converter 200 may include one or more PMOS transistors that are connected in series. The gates of each of the PMOS transistors are grounded. The drain of the PMOS transistor closest to the trigger node N1 is connected to the node N1, while the source of the PMOS transistor at the other end of the array receives the applied external source voltage $V_{DD}$. FIG. 4 illustrates a particular exemplary embodiment where the one or more PMOS transistors in the signal converter includes six PMOS transistors 202, 204, 206, 208, 210, 212 connected in series between the external source voltage $V_{DD}$ and the ground. However, the configuration of the signal converter 200 in FIG. 4 is merely illustrative; exemplary embodiments of the present invention is not thus limited and covers any number of one or more PMOS transistors as will be readily apparent to those skilled in the art.

According to an exemplary embodiment, the first inverter 400 includes one or more PMOS transistors connected in series between the external source voltage $V_{DD}$ and the trigger node N1, and one or more NMOS transistor connected in series between the node N1 and ground. In the first inverter 400, the external source voltage may be applied to the source of the PMOS transistor at one end of the series of PMOS transistors, while the output node of the first inverter is connected to the drain of the PMOS transistor at the other end. Also, the output node of the first inverter is connected to the drain of the NMOS transistor at one end of the series of NMOS transistors in the first inverter 400, while the source of the NMOS transistor at the other end is grounded. The gates of each of the PMOS and NMOS transistors are connected to the trigger node N1.

While FIG. 4 shows the first inverter 400 as including two PMOS transistors 402, 404 connected in series and two NMOS transistors 406, 408, connected in series, exemplary embodiments of the present invention cover any number of one or more PMOS transistors and one or more NMOS transistors included in the first inverter 400 as will be contemplated by those skilled in the art. For example, the first inverter 400 may include a configuration of one PMOS transistor and one NMOS transistor similar to the configuration of the first inverter 62 shown in FIG. 3.

According to an exemplary embodiment, the second inverter 500 may include a plurality of inverter elements connected in series having a similar configuration to the first inverter 400. In this exemplary embodiment, the second inverter 200 includes an odd number of inverter elements, in order to ensure that the last inverter element outputs a high level power up signal VccH in response to the external source voltage $V_{DD}$ reaching the trip voltage Vtrip.

The second inverter 500 may be configured to include a number of inverter elements that will provide a time delay between the time the external source voltage $V_{DD}$ reaches the trip voltage Vtrip to the time the high level power up signal VccH is output, which is sufficient for the external source voltage $V_{DD}$ to reach a normal operating voltage level.

According to an exemplary embodiment, similar to the configuration of the first inverter 400, each inverter element in the second inverter 500 includes one or more PMOS transistors connected in series between the external source voltage $V_{DD}$ and an output node, and one or more NMOS transistors connected in series between the output node and the ground. While the second inverter of FIG. 4 shows a second inverter 500 including five inverter elements 502, 504, 506, 508, 510 connected in series, exemplary embodiments of the present invention cover any number of inverter elements that will be contemplated by those of ordinary skill in the art.

According to an exemplary embodiment, the overall principle of operation of the power up signal generator described above in connection with FIG. 4 follows that of the power up signal generator described in connection with FIG. 3. For example, the signal converter 200, first inverter 400, and second inverter 500 in FIG. 4 perform similar functions as those described for the corresponding elements in FIG. 3. Thus, a description of the operation of these elements will not repeated.

As shown in FIG. 4, the current source 600 includes a reference voltage generator 100 and an NMOS transistor array 300. In the reference voltage generator 100, the external source voltage $V_{DD}$ can be applied to the gate of the NMOS transistor 102. Thus, the NMOS transistor 102 is turned on when the external source voltage $V_{DD}$ applied through the resistor R1 rises to a threshold voltage Vthn of the NMOS transistor 102. When the NMOS transistor 102 is turned on, the NMOS transistor 104 is turned on and outputs a reference voltage $V_{Ref}$ according to Equation 2 below:

$$V_{Ref}=(1+r1/r2)\times V\text{thn} \qquad \text{Eq. 2}$$

where
r1 is the resistance value of resistor R1, and
r2 is the resistance value of resistor R2.

When the reference voltage $V_{Ref}$ is generated by the reference voltage generator 100 according to Equation 2, the current source 300 can produce a reference current $I_{Ref}$ based on Equation 3 below:

$$I_{Ref}=(1/2)\times\beta_n(V_{N1}-V\text{thn})^{1/2} \qquad \text{Eq. 3}$$

where
$V_{N1}$ is the voltage level at node N1, and
$\beta_n$ is the gate capacitance per unit area of the NMOS transistor 104.

As the reference current $I_{Ref}$ flows through the current source 300, the voltage source $V_{DD}$ rises until it reaches a trip voltage Vtrip of the inverter 400 corresponding to the following mathematical expression:

$$V\text{trip}=V\text{th}+(r1/r2\times\beta_n/\beta_p)^{1/2} \qquad \text{Eq. 4}$$

where
Vth is the threshold voltage associated with the one or more PMOS transistors connected in series in the signal converter 200, and
$\beta_p$ is the gate capacitance per unit area associated with the one or more PMOS transistors in the signal converter 200.

Accordingly, if the resistance values r1 and r2 resistors R1 and R2, respectively, are such that the value r1/r2<<1, the trip voltage Vtrip is approximately equal to the threshold voltage Vth of one of the PMOS transistors in the first inverter 400. Thus, the trip voltage Vtrip is effectively influenced by a change of temperature only as much as a voltage threshold of a single PMOS transistor is influenced.

As described above, exemplary embodiments of the present invention utilize a PMOS transistor-based signal converter and a current source in a power up signal generator to reduce the dependency of a trip voltage Vtrip on the threshold voltages Vth of MOSFET transistors. This provides more stability in the trip voltage Vtrip over a wide range of operating temperatures, thus helping to prevent the internal circuits of, for example, a semiconductor memory device to be activated before an externally applied voltage source has reached a normal operating level and internal components have reached their proper states. Furthermore, exemplary embodiments of the present invention can lower the trip voltage to provide stable operation in generating a power up signal when a lower level external source voltage is applied.

In addition, exemplary embodiments of the present invention allow the trip voltage to be in part dependent on the external source voltage, which allows the trip voltage to be lowered to approximately the level of the threshold voltage of a PMOS transistor. Thus, after the external source voltage $V_{DD}$ is stabilized at a normal level, the reduced trip voltage Vtrip helps prevent a power up signal from being disabled (changed to a low level signal) in response to a drop in the external source voltage $V_{DD}$ level.

While the present invention has been particularly shown and described with reference to the exemplary embodiments described above, it will be understood by those skilled in the art that these exemplary embodiments do not limit the scope of the present invention. Rather, various changes in form and details may be made without departing from the spirit and scope of the invention as defined by the appended claims.

What is claimed is:

1. A power up signal generator, comprising:
    a signal converter for converting an external source voltage signal to an internal supply voltage signal applied at a node in response to the external source voltage signal reaching a first threshold, the signal converter not requiring a reset signal;
    a reference current source for maintaining a reference current $I_{Ref}$ flowing from the node, the reference current source including a reference voltage generator for receiving the external source voltage signal and generating a reference voltage, a current maintained by the reference current source being dependent on the reference voltage;
    a first inverter for outputting the external source voltage signal until the internal supply voltage signal at the node reaches a second threshold, the first inverter outputting a low level signal when the internal supply voltage reaches the second threshold; and
    a second inverter for outputting the external source voltage signal as a power up signal after the first inverter outputs the low level signal, the reference voltage generator further including a first and second resistor connected to at least one NMOS transistor in the reference voltage generator, wherein the reference voltage generator and the reference current source are configured such that the internal supply voltage signal reaches the second threshold when the external source voltage reaches a trip voltage $V_{TRIP}$ of:

$$V_{TRIP} = V_{th} + (r1/r2 * \beta_n/\beta_p)^{1/2}$$

wherein
    $V_{th}$ threshold voltage associated with the one or more PMOS transistors of the signal converter,
    $r_1$ and $r_2$ are resistances associated with the first and second resistor, respectively,
    $\beta_n$ is a gate capacitance per unit area associated with the at least one NMOS transistor of the reference voltage generator, and $\beta_p$ is a gate capacitance per unit area associated with the one or more PMOS transistors of the signal converter.

2. The generator of claim 1, wherein the second inverter is configured to output the power up signal after a delay time elapses from when the first inverter outputs the low level signal, the delay time being sufficient for the external voltage source to reach an operating voltage level.

3. The signal generator of claim 1, wherein the reference current source is configured as a constant current source, which maintains the reference current $I_{Ref}$ to be substantially unaffected by changes in an operating temperature.

4. The signal generator of claim 1, wherein the reference current source is configured as a proportional to absolute temperature (PTAT) current source, which maintains a reference current $I_{Ref}$ to flow from the node, the reference current $I_{Ref}$ being substantially proportional to the operating temperature.

5. The signal generator of claim 1, wherein the signal converter includes at least one PMOS transistor whose gate is grounded, the external source voltage being applied to the source of the at least one PMOS transistor, a drain of the at least one PMOS transistor being connected to the node.

6. The signal generator of claim 5, wherein the at least one PMOS transistor includes a plurality of PMOS transistors connected in series between the external supply voltage and the node, the gates of the plurality of PMOS transistors being grounded.

7. The signal generator of claim 5, wherein the reference current source is connected between the node and a ground, the internal supply voltage signal reaching the second threshold when the external source voltage reaches a trip voltage, the trip voltage being dependent on a single PMOS transistor threshold voltage and the current maintained by the reference current source.

8. The signal generator of claim 5, wherein the first inverter includes one or more NMOS transistors connected in series with one or more PMOS transistors, the second threshold being a threshold voltage of the NMOS transistors.

9. The signal generator of claim 8, wherein:
    the one or more PMOS transistors of the first inverter are connected in series between the external source voltage and an output of the first inverter,
    the one or more NMOS transistors of the first inverter are connected in series between the output of the first inverter and the ground, and
    the gates of the NMOS and PMOS transistors are connected to the node.

10. The signal generator of claim 8, the signal generator being configured such that the internal supply voltage signal reaches the second threshold when the external source voltage reaches a trip voltage $V_{TRIP}$ of:

$$V_{TRIP} = V_{thp} + (2I_{Ref}/\beta)^{1/2},$$

wherein
    $V_{thp}$ is a threshold voltage associated with the at least one PMOS transistor of the signal converter, $\beta$ is a gate capacitance per unit area associated with the at least one PMOS transistor, and $I_{Ref}$ is the current maintained by the reference current source.

11. The signal generator of claim 5, wherein the second inverter includes a plurality of inverting elements connected in series with an output node of the first inverter.

12. The signal generator of claim 1, wherein the internal supply voltage signal at the node is dependent upon at least one of the gate capacitance $\beta_n$ and the gate capacitance $\beta_p$.

13. The signal generator of claim 12, wherein:
    the reference voltage generator includes,
    a first NMOS transistor, the external voltage source being applied to a gate of the first NMOS transistor, a first resistor having resistance $r_1$ coupling the external source voltage to a source of the first NMOS transistor, a drain of the first NMOS transistor being grounded via a second resistor having resistance $r_2$; and
    a second NMOS transistor whose gate is connected to the drain of the first NMOS transistor and whose drain is grounded, the first resistor coupling the external voltage source to a source of the second NMOS transistor, the source of the second NMOS transistor outputting the reference voltage, and
    the reference current source further includes an array of one or more NMOS transistors connected in series between the node and the ground, gates of the array receiving the reference voltage.

14. The signal generator of claim 12, the reference voltage generator including a first and second resistor connected to at least one NMOS transistor, wherein the reference voltage generator is configured such that the reference voltage $V_{Ref}$ is determined according to:

$$V_{Ref} = V_{thn}(1 + r_1/r_2),$$

wherein
$V_{thn}$ is a threshold voltage associated with the at least one NMOS transistor of the reference voltage generator.

15. The signal generator of claim 14, wherein the reference current source is configured to maintain a reference current $I_{Ref}$ of:

$$I_{Ref} = \tfrac{1}{2} * \beta_n (V_{N1} - V_{thn})^{1/2},$$

wherein
$V_{thn}$ is a threshold voltage of the second NMOS transistor, and $V_{N1}$ is a voltage level at an internal node.

* * * * *